(12) United States Patent
Mayer et al.

(10) Patent No.: US 7,307,487 B2
(45) Date of Patent: Dec. 11, 2007

(54) DRIVER DEVICE FOR A VOLTAGE-CONTROLLED OSCILLATOR

(75) Inventors: Hermann Mayer, Vaihingen (DE); Joerg Hilserecher, Gerlingen (DE); Guenter Vogel, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 11 days.

(21) Appl. No.: 10/529,971

(22) PCT Filed: May 19, 2003

(86) PCT No.: PCT/DE03/01602

§ 371 (c)(1),
(2), (4) Date: Nov. 2, 2005

(87) PCT Pub. No.: WO2004/032326

PCT Pub. Date: Apr. 15, 2004

(65) Prior Publication Data

US 2006/0111068 A1    May 25, 2006

(30) Foreign Application Priority Data

Oct. 1, 2002    (DE) ............................... 102 45 799

(51) Int. Cl.
  *H03C 3/09*    (2006.01)
  *H03L 7/185*   (2006.01)
(52) U.S. Cl. ..................................... 331/186; 331/185
(58) Field of Classification Search ................. 331/186
  See application file for complete search history.

(56) References Cited

U.S. PATENT DOCUMENTS

| 6,351,191 | B1 | 2/2002 | Nair et al. |
| 6,621,449 | B1* | 9/2003 | Kunert ........................ 342/70 |
| 7,151,479 | B2* | 12/2006 | Beez et al. ................... 342/70 |
| 7,161,526 | B2* | 1/2007 | Cornic et al. ................. 342/27 |
| 2002/0039051 | A1 | 4/2002 | Ota et al. |

OTHER PUBLICATIONS

Kaenel V Von et al: "A Voltage Reduction Technique for Battery-Operated Systems" IEEE Journal of Solid-State Circuits, IEEE Inc. New York, US, Bd. 25, Nr. 5, Oct. 1, 1990, Seiten 1136-1140, XP000162795 ISSN: 0018-9200.
Zhang Z-X et al: "A 360 MHZ 3V CMOS PLL With IV Peak-to-Peak Power Supply Noice Tolerance" IEEE International Solid State Circuits Conference, IEEE Inc. New York, US Bd. 39, Feb. 1, 1996, Seiten 134-135,431, XP000685566 ISSN: 0193-6530.

* cited by examiner

*Primary Examiner*—Joseph Chang
(74) *Attorney, Agent, or Firm*—Kenyon & Kenyon LLP

(57) ABSTRACT

A driver device for a voltage-controlled oscillator, having an unstable voltage source, a voltage regulator, a driver for generating a control voltage for the oscillator, and a feedback loop which controls the driver as a function of the output signal of the oscillator; the voltage regulator supplying the feedback loop with operating voltage while the driver is powered by the unregulated voltage of the voltage source, and the feedback loop compensates for voltage fluctuations of the voltage source with the aid of the driver.

6 Claims, 2 Drawing Sheets

DRIVER DEVICE FOR A VOLTAGE-CONTROLLED OSCILLATOR

FIELD OF THE INVENTION

The present invention relates to a driver device for a voltage-controlled oscillator, having an unstable voltage source, a voltage regulator, a driver for generating a control voltage for the oscillator, and a feedback loop which controls the driver as a function of the output signal of the oscillator. The present invention particularly relates to a driver device for a microwave oscillator, e.g. a Gunn diode, of a radar system which is designed to be installed in motor vehicles.

BACKGROUND INFORMATION

In motor vehicles, radar systems are used for measuring the distances and relative speeds of preceding vehicles, so that automatic speed control and distance control (ACC; Adaptive Cruise Control) can be implemented. The frequency of the microwave radiation generated by the oscillator is controlled, using the voltage applied to this oscillator. This frequency must often be modulated in the course of the radar measurements. For example, in the case of FMCW (Frequency Modulated Continuous Wave) radar, frequency is modulated using different frequency ramps, so that the differential frequency (difference in frequency) between the emitted radar signal and the radar echo becomes a function of the propagation time. The distances of objects located by the radar sensor can then be determined by evaluating the differential frequency spectrum.

For a high measurement accuracy, it is necessary that the frequencies generated by the oscillator correspond to the modulation signal with high precision. For this purpose, the frequency of the oscillator is controlled with the aid of the feedback loop and the driver in a closed control loop. In known systems, the feedback loop is a frequency-locked loop (FLL; Frequency Locked Loop). In this case, the modulation signal is a voltage signal, which indicates the setpoint frequency value valid for the specific time. The frequency of the oscillator is also converted into a voltage and compared to the modulation signal, and the driver is controlled on the basis of the comparison result.

In motor vehicles, the vehicle battery is available as a voltage source for the driver device. However, the problem with this is that this voltage source is unstable, since, depending on the charge of the battery, the battery voltage is subjected to more or less sharp fluctuations when switching other loads in the vehicle on or off. In order that the functioning of the driver device and the oscillator is not affected by such voltage fluctuations, a voltage regulator, which supplies both the driver and the feedback loop with a regulated and, therefore, stable operating voltage, has been provided, till now, between the vehicle battery and the driver.

However, the known set-up has the disadvantage that a certain, minimum voltage drop inevitably occurs at the voltage regulator, so that the DC voltage available to the driver and the oscillator is considerably lower than the battery voltage. Therefore, when the voltage of the vehicle battery is low, there may not be sufficient voltage available for operating the oscillator, and consequently, the radar system must be switched off.

SUMMARY OF THE INVENTION

An object of the exemplary embodiment and/or exemplary method of the present invention is to provide a driver device, which allows a higher tolerance to a low battery voltage.

The object of the exemplary embodiment and/or exemplary method of the present invention is achieved in that the voltage regulator supplies the feedback loop with operating voltage, while the driver is powered by the unregulated voltage source, and that the feedback loop is designed to compensate for voltage fluctuations of the voltage source with the aid of the driver.

In this design approach, the inevitable voltage drop at the voltage regulator therefore does not affect the voltage available to the driver, so that even when the battery voltage is low, a sufficient voltage is still available to the driver and the oscillator. In practice, the threshold value for low-voltage shutdown may thus be reduced by approximately 0.5 V, so that a correspondingly higher availability of the system is achieved.

To operate the feedback loop and other electronic components, such as the modulation circuit and a controller for the radar system, a relatively low voltage of, e.g. approximately 5 V is generally required, while the oscillator requires a higher voltage of, e.g. approximately 8 V. The design approach according to the exemplary embodiment and/or exemplary method of the present invention has the advantage that the voltage regulator only needs to provide the lower voltage of 5 V, and that a structural simplification and cost savings are achieved by omitting a separate voltage regulator for the driver and the oscillator.

In the driver device of the present invention, the already present control function of the feedback loop and the driver alone ensures that the fluctuations of the battery voltage do not affect the oscillator. To this end, the circuit must only be designed in such a manner, that the voltage drop at the driver causes the battery voltage, which may be 12 V or more in the case of a fully charged battery, to be reduced to the voltage of approximately 8 V required for operating the oscillator, and that the feedback loop has a sufficiently low control delay as a function of the required frequency accuracy.

The feedback loop may take the form of a phase-locked loop (PLL). An intermediate-frequency signal is formed from the microwave signal generated by the oscillator, by mixing the microwave signal with a reference signal having a fixed frequency; the frequency of the intermediate-frequency signal being equal to the difference between the microwave frequency and the reference frequency. The PLL compares the phase of the intermediate-frequency signal to the phase of a reference signal, whose frequency corresponds to the desired microwave frequency and, if indicated, is modulated according to the utilized measuring principal (e.g. FMCW). The PLL then forms a control signal for the driver on the basis of the phase difference. Since the phase difference reacts (responds) very critically to deviations in frequency between the intermediate-frequency signal and the reference signal, the phase-locked feedback loop allows any deviations of the microwave frequency from the setpoint value represented by the reference signal to be rapidly corrected (compensated for), in particular, even when such deviations are caused by fluctuations in the battery voltage.

A filter circuit, which may also include a reverse-polarity protection circuit, but not a voltage regulator, may be provided between the voltage source and the driver. Since such a filter circuit functions in a nearly non-dissipative manner, the voltage drop caused by it is negligible.

In a modified specific embodiment, the filter circuit includes a voltage limiter, which limits the battery voltage, which can be up to 17 V, to a value of approximately 9 to 10 V. In this manner, the power loss is divided between the driver and the filter circuit, when the battery voltage is very high. However, when the battery voltage falls below the limiting value of 9 or 10 V, the current limiter becomes inactive (inoperative), and only the voltage drop at the driver remains.

With the exception of the battery, the components of the driver device may optionally be integrated to form one unit or designed separately to have a modular construction.

A radar system for motor vehicles, which is provided with the above-discussed driver device, is described herein.

DETAILED DESCRIPTION

Figure 1:
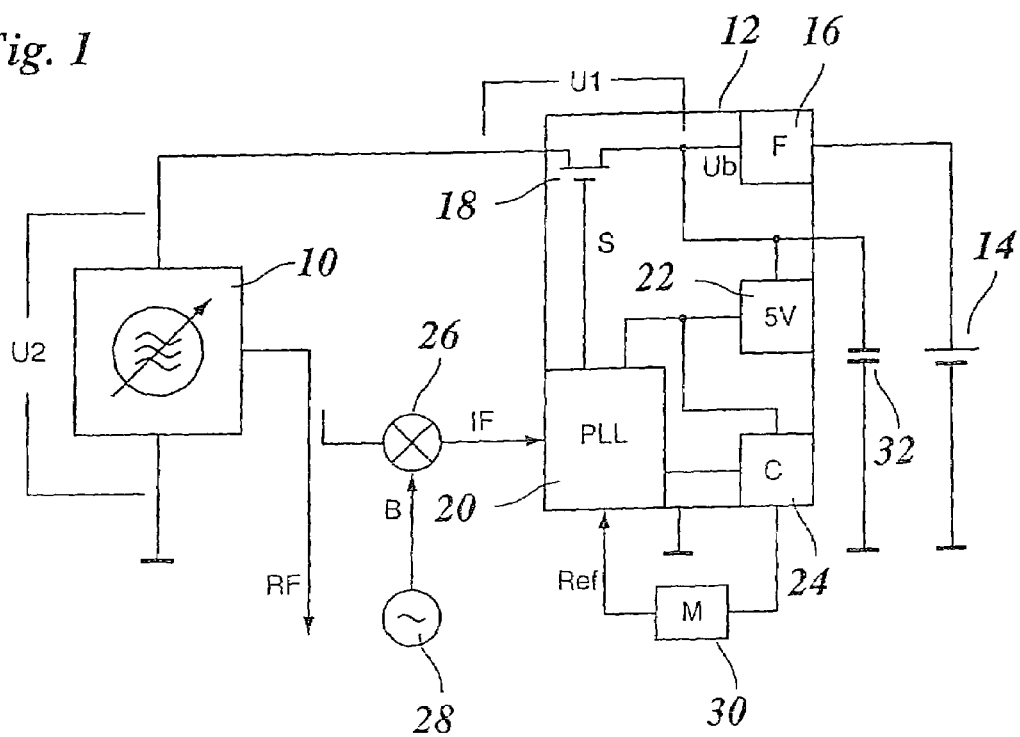
FIG. 1 shows a simplified circuit sketch of an oscillator and a corresponding driver device.

FIG. 1 shows a voltage-controlled oscillator 10, a corresponding driver device 12, as well as a voltage source, which takes, in this case, the form of a battery 14 of a motor vehicle. In the example shown, oscillator 10 is a Gunn diode of a microwave radar, which is used in the motor vehicle to measure distance.

Driver device 12 includes a filter circuit 16, a driver 18 (transistor), a feedback loop 20 taking the form of a phase-locked loop (PLL), a voltage regulator 22, and, in the example shown, a controller 24 as well, which controls the functions of feedback loop 18 and oscillator 10 and, if indicated, those of other components of the distance-measuring system.

Filter circuit 16 is connected to battery 14 and is used, first and foremost, to filter out interference signals that could be coupled in via the line coming from the battery. In addition, the filter circuit has the function of protecting against polarity reversal. Battery voltage Ub is filtered by filter circuit 16, but is transmitted unregulated to driver 18. Therefore, practically no voltage drop occurs in filter circuit 16.

Driver 18 is activated in such a manner by a control signal S generated by feedback loop 20, that a specific voltage drop U1 occurs at the driver, and the driver supplies oscillator 10 with a control voltage U2 that is equal to the difference between Ub and U1. The level of control voltage U2 determines the frequency of microwave signal RF generated by oscillator 10. At the same time, control voltage U2 constitutes the operating voltage of oscillator 10 and consequently provides the energy, which the oscillator requires for producing the microwave radiation. Control voltage U2 is typically on the order of approximately 8 V.

The frequency of microwave signal RF generated by oscillator 10 is controlled in a closed control loop and modulated as required. For this purpose, microwave signal RF is extracted and mixed in a mixer 26 with a reference signal B, which has a fixed frequency and is generated by a further oscillator, e.g. a dielectric resonator 28. The output signal of mixer 26 is an intermediate-frequency signal IF, whose frequency is equal to the difference between the frequency of the microwave signal and the frequency of reference signal B. This intermediate-frequency signal IF is supplied to feedback loop 20.

Furthermore, feedback loop 20 receives a reference signal Ref having a variable frequency, which is of the same order of magnitude as the frequency of intermediate-frequency signal IF. Feedback loop 20 compares the phase of intermediate-frequency signal IF to the phase of reference signal Ref and generates control signal S for driver 18 on the basis of the comparison result. In this manner, the frequency of oscillator 10 is controlled so that a fixed phase relationship is maintained between intermediate-frequency signal IF and reference signal Ref. Therefore, the frequency of microwave signal RF is rigidly coupled to the frequency of reference signal Ref, with very little control delay.

Controller 24 controls a modulator 30 which, on its part, varies the frequency of reference signal Ref, so that the microwave signal is modulated in the desired manner.

Voltage regulator 22 supplies a controlled operating voltage of 5 V to feedback loop 20 and controller 24 (as well as to modulator 30, if indicated) and is powered, on its part, by the output voltage of filter circuit 16. In addition, a smoothing capacitor 32 is connected between the output of filter circuit 16 and ground.

Figure 2:
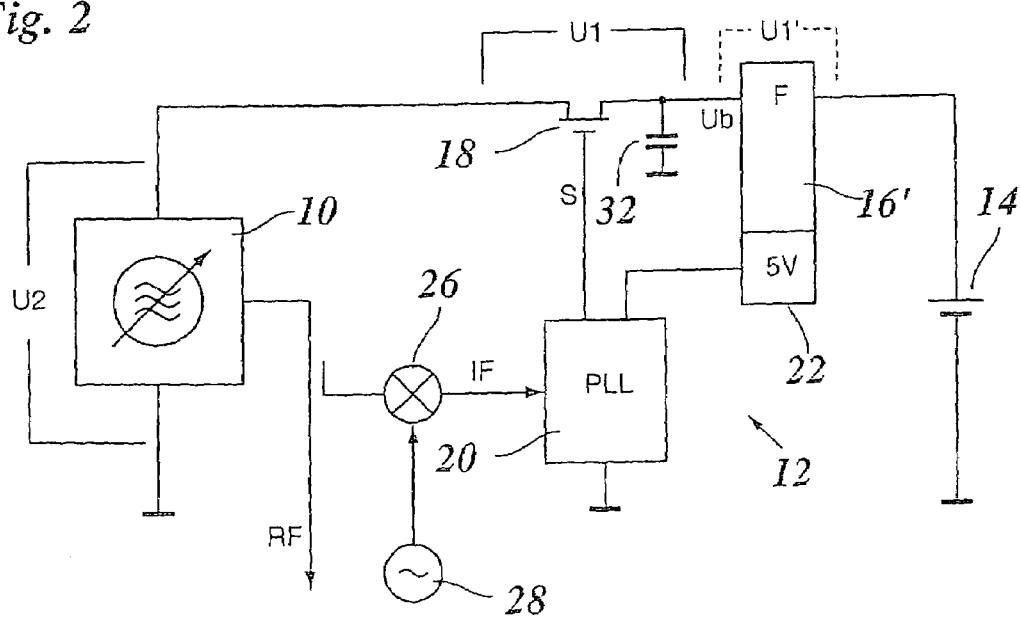
FIG. 2 shows a circuit sketch of an oscillator and a driver device according to a modified exemplary embodiment.

The exemplary embodiment shown in FIG. 2 differs from the above-described exemplary embodiment in that the main components of the driver circuit take the form of separate components, which may also be situated on different printed circuit boards. In addition, a filter circuit 16', which simultaneously has a voltage limiting function and limits the voltage of battery 14 to a specific maximum value on the order of 9 to 10 V, is provided in place of filter circuit 16.

Therefore, when battery voltage Ub is above this maximum value, an additional voltage drop U1' occurs at filter circuit 16. This has the advantage that the power loss is divided up between driver 18 and filter circuit 16', so that higher voltages of battery 14 may also be tolerated. However, filter circuit 16' also does not have a control function in this case, and voltage drop U1' decreases to 0 when the battery voltage falls below the limiting value of 9 to 10 V. Therefore, a low battery voltage may be tolerated, as long as the battery voltage is greater than the sum of control voltage U2 and residual voltage drop U1, which is also inevitable when the driver is controlled (activated) at a maximum level. The controller and the modulator are not shown in FIG. 2.

Figure 3:
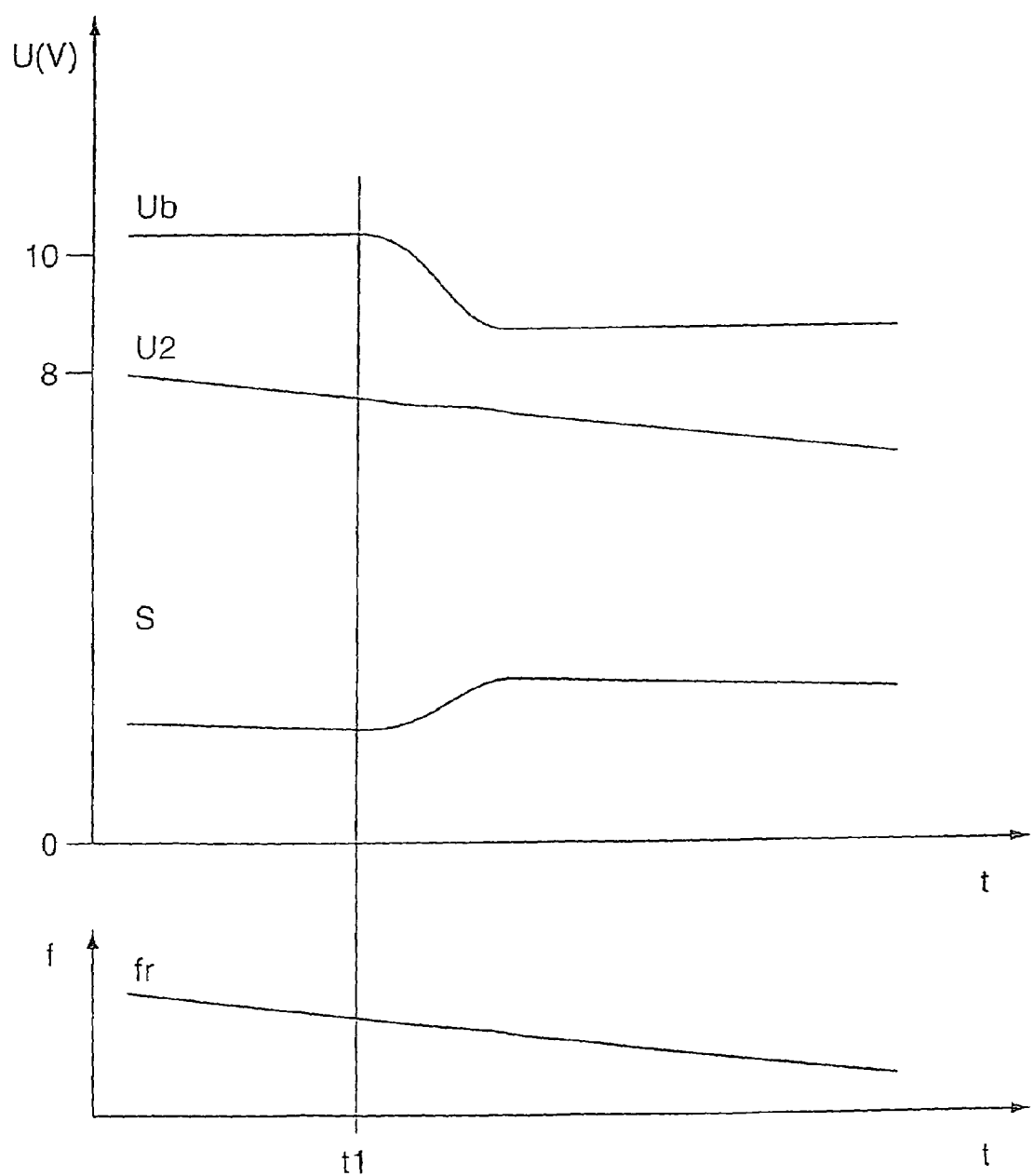
FIG. 3 shows a time-dependency diagram for explaining the method of functioning of the driver devices.

FIG. 3 illustrates the control function of the driver device according to FIG. 1, using as an example an operating phase, in which frequency fr of microwave signal RF is modulated with a decreasing ramp, as is shown in the frequency/time graph in the lower part of FIG. 3. At time t1, battery voltage Ub decreases from a value greater than 10 V to a value of less than 9 V, because, for example, an additional load was switched on in the vehicle. Without frequency regulation, this voltage drop would lead to a corresponding decrease in control voltage U2 and, consequently, to a decrease in frequency fr. However, this voltage drop is instantaneously compensated for by feedback loop 20. Control signal S increases, so that voltage drop U1 at driver 18 decreases and control voltage U2 is essentially maintained at the previous value. At the same time, control signal S ensures that the phase relationship between intermediate-frequency signal IF and reference signal Ref is retained, so that control voltage U2 and, therefore, frequency fr of the microwave signal as well, decrease with the frequency of reference signal Ref, in accordance with the ramp function.

The above explanation of the functioning method also applies analogously to the exemplary embodiment according to FIG. 2.

What is claimed is:

1. The driver device for a voltage-controlled oscillator, comprising:
   an unstable voltage source;
   a voltage regulator;
   a driver to generate a control voltage for the oscillator; and
   a feedback loop to control the driver as a function of an output signal of the oscillator; and
   wherein the voltage regulator supplies the feedback loop with operating voltage, while the driver is powered by the unregulated voltage of the voltage source, and the feedback loop compensates for voltage fluctuations of the voltage source with the aid of the driver, and
   wherein the feedback loop receives an intermediate-frequency signal, which is formed by mixing the output signal of the oscillator with a reference signal having a fixed frequency, and the feedback loop compares the phase of the intermediate-frequency signal to the phase of a reference signal and controls the driver based on the comparison result so that a frequency of the oscillator follows a frequency of the reference signal.

2. The driver device of claim 1, wherein the feedback loop includes a phase-locked loop.

3. The driver device of claim 1, wherein the control voltage for the oscillator is greater than the operating voltage for the feedback loop supplied by the voltage regulator.

4. The driver device of claim 1, wherein a filter circuit is inserted between the voltage source and the driver.

5. The driver device of claim 4, wherein the filter circuit includes a voltage-limiting function.

6. The driver device of claim 4, wherein at least the filter circuit and the driver take the form of separate components.

* * * * *